United States Patent
Symanczyk (10) Patent No.: US 7,515,454 B2
(45) Date of Patent: Apr. 7, 2009

(54) CBRAM CELL AND CBRAM ARRAY, AND METHOD OF OPERATING THEREOF

(75) Inventor: Ralf Symanczyk, Tuntenhausen (DE)

(73) Assignees: Infineon Technologies AG, Munich (DE); Altis Semiconductor, SNC, Corbeil Essonnes Cedex (FR)

(*) Notice: Subject to any disclaimer, the term of this patent is extended or adjusted under 35 U.S.C. 154(b) by 339 days.

(21) Appl. No.: 11/497,810

(22) Filed: Aug. 2, 2006

(65) Prior Publication Data
US 2008/0029842 A1    Feb. 7, 2008

(51) Int. Cl.
*G11C 11/00* (2006.01)
*H01L 47/00* (2006.01)

(52) U.S. Cl. .................. 365/148; 365/163; 257/4; 257/154; 257/489; 257/537; 257/E21.294; 257/E21.495

(58) Field of Classification Search .......... 365/148, 365/163; 257/4, 154, 489, 537, E21.294, 257/E21.495
See application file for complete search history.

(56) References Cited

U.S. PATENT DOCUMENTS

| | | | |
|---|---|---|---|
| 3,271,591 A | 9/1966 | Ovshinsky | |
| 7,009,278 B2 | 3/2006 | Hsu | |
| 2005/0270826 A1 | 12/2005 | Mikolajick et al. | |
| 2006/0060832 A1* | 3/2006 | Symanczyk et al. | 257/3 |
| 2006/0071272 A1 | 4/2006 | Alvarado et al. | |
| 2006/0109708 A1* | 5/2006 | Pinnow et al. | 365/163 |
| 2006/0175640 A1* | 8/2006 | Happ et al. | 257/288 |

FOREIGN PATENT DOCUMENTS

| | | |
|---|---|---|
| DE | 1 261 252 | 2/1968 |
| DE | 76 744 | 10/1970 |
| DE | 102 55 117 A1 | 6/2004 |
| DE | 698 25 923 T2 | 9/2005 |
| DE | 10 2005 001 253 A1 | 7/2006 |
| EP | 1 235 227 B1 | 4/1998 |
| EP | 1 643 508 A2 | 9/2005 |
| GB | 1147355 | 4/1969 |
| WO | WO 2006/003620 A1 | 1/2006 |

OTHER PUBLICATIONS

Kozicki, M.N., et al., "Applications of Programmable Resistance Changes in Metal-Doped Chalcogenides," Electrochemical Society Proc., vol. 99-13 (1999) pp. 298-309.

Neal, R., "Micron To Look Again at Non-Volatile Amorphous Memory," Electronic Engineering Design (2002) 6 pages.

(Continued)

*Primary Examiner*—Ly D Pham (57) ABSTRACT

According to one embodiment of the present invention, a CBRAM cell includes a solid electrolyte block having at least three solid electrolyte contacting areas, electrodes electrically connected to the solid electrolyte contacting areas, wherein conductive paths are formable, erasable or detectable within the solid electrolyte block by applying voltages between the solid electrolyte contacting areas using the electrodes as voltage suppliers, and wherein the contacting areas are spatially separated from each other such that conductive paths starting from different solid electrolyte contacting areas or ending at different solid electrolyte contacting areas do not overlap each other.

24 Claims, 5 Drawing Sheets

OTHER PUBLICATIONS

Prince, B., "Emerging Memories—Technology and Trends," Kluwer Academic Publishers (2002) pp. 254-257.

Symanczyk, R., et al., "Electrical Characterization of Solid State Ionic Memory Elements," Proceedings Non-Volatile Memory Technology Symposium (2003) vol. 17-1, 6.

Kund, M., et al., Conductive Bridging RAM (CBRAM): An Emerging Non-Volatile Memory Technology Scalable to Sub 20nm, IEDM (2005) 4 pages.

Eitan, B., "NROM™ Device to Product," ULIS (2002) 3 pages.

* cited by examiner

FIG 1A $R_{on}$ state

FIG 1B $R_{off}$ state

CBRAM CELL AND CBRAM ARRAY, AND METHOD OF OPERATING THEREOF

TECHNICAL FIELD

The invention relates to a CBRAM cell as well as to a CBRAM cell array, and method of operating thereof.

BACKGROUND

Solid electrolyte random access memory technology (in the following also referred to as conductive bridging random access memory (CBRAM) technology) is expected to become an important memory technology in the future. However, in order to be competitive with other existing memory technologies like DRAM or FLASH, an increase in the memory density of CBRAM devices is desireable.

SUMMARY OF THE INVENTION

According to one embodiment of the present invention, a CBRAM cell is provided, including a solid electrolyte block (in the following also referred to as an ion conductor block) having at least three solid electrolyte contacting areas (in the following also referred to as ion conductor contacting areas), electrodes electrically connected to the solid electrolyte contacting areas, wherein conductive paths are formable, erasable or detectable within the solid electrolyte block by applying voltages between the solid electrolyte contacting areas, wherein the contacting areas are spatially separated from each other such that conductive paths starting from different solid electrolyte contacting areas or ending at different solid electrolyte contacting areas do not overlap each other.

BRIEF DESCRIPTION OF THE DRAWINGS

For a more complete understanding of the present invention and the advantages thereof, reference is now made to the following description taken in conjunction with the accompanying drawings, in which:

FIG. 11b shows a schematic cross-sectional view of the embodiment shown in FIG. 11a.

DETAILED DESCRIPTION OF ILLUSTRATIVE EMBODIMENTS

According to one embodiment of the present invention, a CBRAM cell includes a solid electrolyte block having at least three solid electrolyte contacting areas, electrodes electrically connected to the solid electrolyte contacting areas, wherein conductive paths are formable, erasable or detectable within the solid electrolyte block by applying voltages between the solid electrolyte contacting areas using the electrodes as voltage suppliers, and wherein the contacting areas are spatially separated from each other such that conductive paths starting from different solid electrolyte contacting areas or ending at different solid electrolyte contacting areas do not overlap each other.

Within the scope of the present invention, the term "solid electrolyte block" is to be understood as solid electrolyte material that is only usable by one single CBRAM cell (i.e., other CBRAM cells that might be arranged around the CBRAM cell have their "own" solid electrolyte block isolated from the solid electrolyte block of the CBRAM cell). In other words, the solid electrolyte block of the CBRAM cell according to embodiments of the present invention is not part of a continuous solid electrolyte layer that is shared by several CBRAM cells positioned around the CBRAM cell.

The solid electrolyte block of the CBRAM cell according to embodiments of the present invention includes more solid electrolyte contacting areas than conventional CBRAM cells (which have two solid electrolyte contacting areas). The solid electrolyte contacting areas are chosen such that different conductive paths can be formed within one single solid electrolyte block normally used for one conductive path only. As a consequence, a higher memory density can be achieved without having the need of scaling down the spatial dimensions of the solid electrolyte block. Thus, accuracy problems occurring when dividing a solid electrolyte layer into very small solid electrolyte blocks can be avoided. In other words, instead of reducing the dimensions of the solid electrolyte block, the structure or dimensions of electrodes electrically connecting the solid electrolyte block is reduced such that the number of electrodes can be increased.

Generally, an arbitrary number of solid electrolyte contacting areas is possible. Further, the positions of the solid electrolyte contacting areas can be freely chosen. Generally, the only thing that should be guaranteed is that different conductive paths do not overlap each other. In the following, some concrete examples will be discussed.

According to one embodiment of the present invention, the solid electrolyte contacting areas include first and second solid electrolyte contacting areas that are positioned over a first surface of the solid electrolyte block, and a common solid electrolyte contacting area that is positioned over a second surface of the solid electrolyte block, wherein conductive paths starting from the first or second solid electrolyte contacting areas end at the common solid electrolyte contacting area. The first and the second surface of the solid electrolyte block may be arbitrary surfaces like the top surface, the bottom surface, the front surface, the back surface or the side surfaces of the solid electrolyte block (depending on the shape of the solid electrolyte block).

According to one embodiment of the present invention, the positions of the first and the second solid electrolyte contacting areas on the first surface are chosen such that the distance between the first and the second solid electrolyte contacting areas is as large as possible. This minimizes the probability of cross talk (overlapping of different conductive paths is avoided). For example, if the first surface of the solid electrolyte block has a rectangular shape, the first solid electrolyte contacting area may be positioned at or close to a first edge region of the solid electrolyte block, and the second solid electrolyte contacting area may be positioned at or close to a second edge region of the solid electrolyte block. According to one embodiment, the first edge region faces the second edge region.

According to one embodiment of the present invention, the CBRAM cell further includes a third solid electrolyte contacting area positioned over the first surface between the first and the second solid electrolyte contacting areas, wherein a conductive path starting from the third solid electrolyte contacting area ends at the common solid electrolyte contacting area.

According to one embodiment of the present invention, the solid electrolyte contacting areas include a first solid electrolyte contacting area, a second solid electrolyte contacting area, a third solid electrolyte contacting area and a fourth solid electrolyte contacting area that are positioned over a first surface of the solid electrolyte block, and a common solid electrolyte contacting area that is positioned over a second surface of the solid electrolyte block, wherein conductive paths starting from the first, second, third or fourth solid electrolyte contacting areas end at the common solid electrolyte contacting area. In this embodiment, the first surface of the solid electrolyte block may for example have a rectangular shape, each of the first to fourth solid electrolyte contacting areas being positioned at or close to a different corner of the first surface.

According to one embodiment of the present invention, the CBRAM cell further includes a resistance layer that is provided over a first surface of the solid electrolyte, wherein at least a part of the resistance layer is positioned between the solid electrolyte contacting areas positioned over the first surface, and wherein the resistance layer has a higher electrical resistance than that of the electrodes contacting the solid electrolyte contacting areas positioned over the first surface.

According to one embodiment of the present invention, the solid electrolyte contacting areas are surface areas of the solid electrolyte surface, which are directly contacted by the electrodes. Alternatively, at least one solid electrolyte contacting area may at least partly be covered by the resistance layer. In the latter case, at least parts of the resistance layer that cover the solid electrolyte contacting areas may include ions necessary for forming the conductive paths (ion reservoir). The material of the resistance layer may be the same as that of the first electrodes, the thickness of the resistance layer, however, being smaller than the thickness of the first electrodes.

According to one embodiment of the present invention, the resistance layer includes metal nitrides like tantalum nitride (TaN) or tungsten nitride (WN) or doped silicon (Si) (in the case of silicon the desired resistance value of the resistance layer is defined by the doping level of the silicon).

According to one embodiment of the present invention, the first surface of the solid electrolyte block faces the second surface of the solid electrolyte block.

According to one embodiment of the present invention, the first surface is the top surface of the solid electrolyte block, and the second surface is the bottom surface of the solid electrolyte block. The invention is not restricted thereto. The first surface may, for example, be a side surface of the solid electrolyte block. In this case, the second surface may, for example, be a further side surface of the solid electrolyte block facing the first surface.

According to one embodiment of the present invention, a CBRAM cell includes a solid electrolyte, electrodes electrically connected to the solid electrolyte that form, erase or detect conductive paths within the solid electrolyte by applying respective voltages to the solid electrolyte, wherein the electrodes include two top electrodes and one bottom electrode that are spatially separated from each other and arranged such that conductive paths formed between the top electrodes and the bottom electrode do not overlap each other.

According to one embodiment of the present invention, a CBRAM cell array having a plurality of CBRAM cells is provided, each CBRAM cell including an solid electrolyte block having at least three solid electrolyte contacting areas, electrodes electrically connected to the solid electrolyte contacting areas, wherein conductive paths are formable, erasable or detectable within the solid electrolyte block by applying voltages between the solid electrolyte contacting areas using the electrodes as voltage suppliers, and wherein the contacting areas are spatially separated from each other such that conductive paths starting from different solid electrolyte contacting areas or ending at different solid electrolyte contacting areas do not overlap each other.

All embodiments discussed in conjunction with the CBRAM cell according to the present invention can also be applied to the CBRAM cell array, and methods of operating thereof, according to the present invention.

The electrodes electrically connected to the solid electrolyte contacting areas are themselves electrically connected to word lines and bit lines.

According to one embodiment of the present invention, a CBRAM cell array includes a plurality CBRAM cells, each CBRAM cell having a solid electrolyte, electrodes electrically connected to the solid electrolyte that form, erase or detect conductive paths within the solid electrolyte by applying respective voltages to the solid electrolyte, wherein the electrodes include two top electrodes spatially separated from each other and one bottom electrode, which are arranged such that conductive paths formed between the top electrodes and the bottom electrode do not overlap each other.

According to one embodiment of the present invention, a method of writing data into a CBRAM cell that includes a solid electrolyte block having at least three solid electrolyte contacting areas, electrodes electrically connected to the solid electrolyte contacting areas, wherein the conductive paths are formable, erasable or detectable within the solid electrolyte block by applying voltages between the solid electrolyte contacting areas using the electrodes as voltage suppliers, wherein the contacting areas are spatially separated from each other such that conductive paths starting from different solid electrolyte contacting areas or ending at different solid electrolyte contacting areas do not overlap each other, includes applying a pulse of energy across the solid electrolyte block by applying a writing voltage between a first solid electrolyte contacting area and a common solid electrolyte contacting area.

According to one embodiment of the present invention, a process of applying a further pulse of energy across the solid electrolyte block is performed by applying a writing voltage between a second solid electrolyte contacting area and the common solid electrolyte contacting area.

According to one embodiment of the present invention, the pulses of energy are applied at the same point of time. However, it is also possible to apply the pulses of energy at different points of time. Applying the pulses of energy at the same point of time has the advantage that two bits can be written at once.

According to one embodiment of the present invention, a method of reading data from a CBRAM cell is provided, the CBRAM cell including a solid electrolyte block having at least three solid electrolyte contacting areas, electrodes electrically connected to the solid electrolyte contacting areas, wherein conductive paths are formable, erasable or detectable within the solid electrolyte block by applying voltages between the solid electrolyte contacting areas using the electrodes as voltage suppliers, wherein the contacting areas are spatially separated from each other such that conductive paths starting from different solid electrolyte contacting areas or ending at different solid electrolyte contacting areas do not overlap each other, the method including applying a voltage between a first solid electrolyte contacting area and a common solid electrolyte contacting area, detecting a current strength of a current passing between the first solid electrolyte contacting area and the common solid electrolyte contacting area, and determining the data stored within the CBRAM cell on the basis of the current strength detected.

According to an embodiment of the present invention, the method further includes the processes of applying a voltage between a second solid electrolyte contacting area and the common solid electrolyte contacting area, detecting a current strength of a current passing between the second solid electrolyte contacting area and the common solid electrolyte contacting area, and determining the data stored within the CBRAM cell on the basis of the current strength detected.

According to an embodiment of the present invention, the detections of the currents are performed at the same point of time.

According to an embodiment of the present invention, the existence/non-existence of two conductive paths within the solid electrolyte block can be simultaneously detected by using two different electrodes only. To enable this, the solid electrolyte contacting areas where the two conductive paths start may be connected with each other by a high resistance layer as discussed above, and both conductive paths may end in a common solid electrolyte contacting area. One of the two different electrodes is connected to the common solid electrolyte contacting area, the other electrode is connected to one of the two connected solid electrolyte contacting areas. The resistance of the sensing current routed through the solid electrolyte block shows four different values depending on the existence/non-existence of the two conductive paths.

According to one embodiment of the present invention, data is written into the CBRAM cell and read from the CBRAM cell by applying respective writing/reading voltages between the solid electrolyte contacting areas. The writing/reading voltages can be applied simultaneously, i.e., two conductive paths can be formed, erased or sensed at the same point of time, respectively. Alternatively, each current path within a CBRAM cell is individually written, erased or sensed.

In the following description, making reference to FIGS. 1a and 1b, a basic principle underlying CBRAM devices will be explained.

Figure 1A:
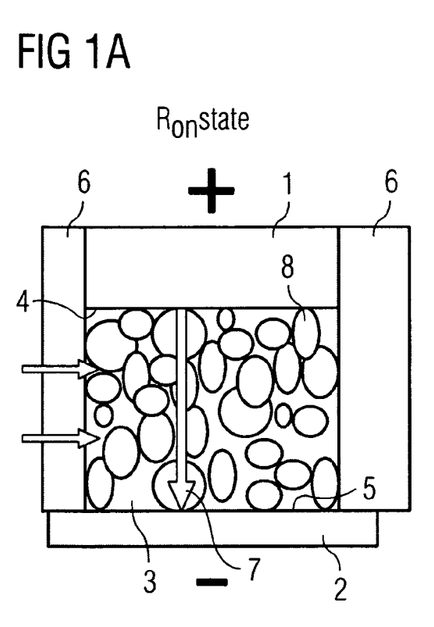
FIG. 1a shows a schematic cross-sectional view of a CBRAM cell set to a first memory state.
Figure 1B:
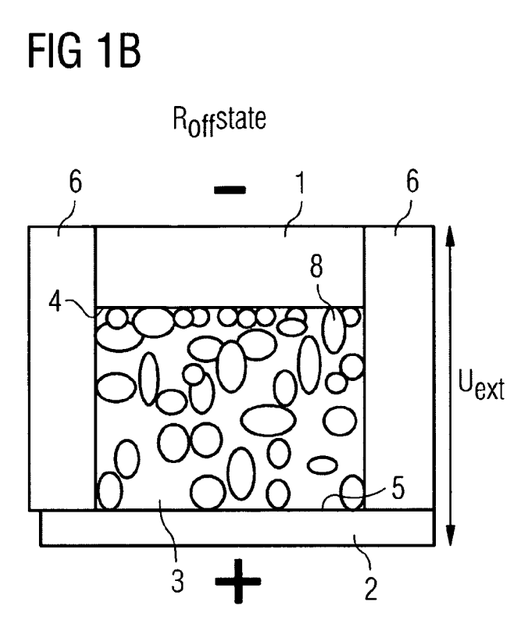
FIG. 1b shows a schematic cross-sectional view of a CBRAM cell set to a second memory state.

As shown in FIG. 1a, a CBRAM cell includes a first electrode 1, a second electrode 2, and a solid electrolyte block (in the following also referred to as an ion conductor block) 3 sandwiched between the first electrode 1 and the second electrode 2. The first electrode 1 contacts a first surface 4 of the ion conductor block 3, the second electrode 2 contacts a second surface 5 of the ion conductor block 3. The ion conductor block 3 is isolated against its environment by an isolation structure 6. The first surface 4 usually is the top surface, and the second surface 5 usually is the bottom surface of the ion conductor 3. In the same way, the first electrode I generally is the top electrode, and the second electrode 2 generally is the bottom electrode of the CBRAM cell. One of the first electrode 1 and the second electrode 2 is a reactive electrode, and the other one an inert electrode. Here, the first electrode I is the reactive electrode, and the second electrode 2 is the inert electrode. In this example, the first electrode 1 includes silver (Ag), the ion conductor block 3 includes silver-doped chalcogenide material, and the isolation structure 6 includes $SiO_2$ or $Si_3N_4$.

If a voltage as indicated in FIG. 1a is applied across the ion conductor block 3, a redox reaction is initiated that drives $Ag^+$ ions out of the first electrode 1 into the ion conductor block 3 where they are reduced to Ag, thereby forming Ag rich clusters within the ion conductor block 3. If the voltage applied across the ion conductor block 3 is applied for a long period of time, the size and the number of Ag rich clusters within the ion conductor block 3 is increased to such an extent that a conductive bridge 7 between the first electrode 1 and the second electrode 2 is formed. In case that a voltage is applied across the ion conductor 3 as shown in FIG. 1b (inverse voltage compared to the voltage applied in FIG. 1a), a redox reaction is initiated that drives $Ag^+$ ions out of the ion conductor block 3 into the first electrode 1 where they are reduced to Ag. As a consequence, the size and the number of Ag rich clusters within the ion conductor block 3 are reduced, thereby erasing the conductive bridge 7.

In order to determine the current memory status of a CBRAM cell, a sensing current is routed through the CBRAM cell. The sensing current experiences a high resistance in case no conductive bridge 7 exists within the CBRAM cell, and experiences a low resistance in case a conductive bridge 7 exists within the CBRAM cell. A high resistance may, for example, represent "0", whereas a low resistance represents "1", or vice versa.

In the following description, with reference to FIGS. 10 to 11, a basic aspect underlying one embodiment of the present invention will be explained.

Figure 10A:
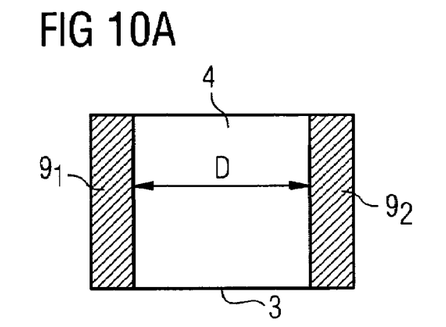
FIG. 10a shows a schematic top view of the embodiment shown in FIG. 4.
Figure 10B:
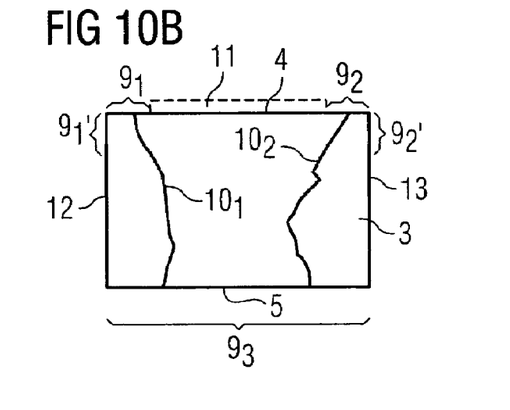
FIG. 10b shows a schematic cross-sectional view of the embodiment shown in FIG. 4.
Figure 10C:
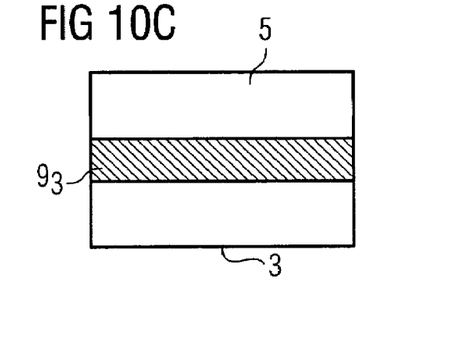
FIG. 10c shows a schematic bottom view of the embodiment shown in FIG. 4.

FIGS. 10a, 10b and 10c show an ion conductor block 3 (FIG. 10a : top view; FIG. 10b : cross-sectional view; FIG. 10c : bottom view) including first to third solid electrolyte contacting areas $9_1$ to $9_3$ (in the following also referred to as ion conductor contacting areas), which are surface areas of the first surface 4 (top surface) and the second surface 5 (bottom surface), respectively. Conductive paths are formable, erasable or detectable within the ion conductor block 3 by applying voltages between the first to third ion conductor contacting areas $9_1$ to $9_3$ using electrodes (not shown) electrically connected to the first to third ion conductor contacting areas $9_1$ to $9_3$ as voltage suppliers. The electrodes can directly contact the first to third ion conductor contacting areas $9_1$ to $9_3$ or indirectly contact the first to third ion conductor contacting areas $9_1$ to $9_3$ (e.g., existence of intermediate layer between the first to third ion conductor contacting areas $9_1$ to $9_3$ and the electrodes), or both directly and indirectly contact the first to third ion conductor contacting areas $9_1$ to $9_3$.

An important aspect according to one embodiment of the present invention is that the first to third ion conductor contacting areas $9_1$ to $9_3$ are spatially separated from each other such that conductive paths 10 starting from different ion conductor contacting areas and/or ending at different ion conductors contacting areas do not overlap each other. In other words, each conductive path 10 has to start from an "own" ion conducting contacting area or has to end in an "own" ion conductor contacting area. It is also possible that each current path 10 starts and ends in an own ion conductor contacting area, however, this is not necessary. Either the ion conductor contacting area where the conductive path ends, or the ion conductor contacting area where the conductive path 10 starts, can also be shared by other conductive paths. In the embodiment shown in FIGS. 10a to 10c, a first and a second conductive path $10_1$, $10_2$ have different starting points (first and second ion conductor contacting areas $9_1$, $9_2$) and have one common ending point (third ion conductor contacting area $9_3$). The distance D between the first ion conductor contacting area $9_1$ and the second ion conductor contacting area $9_2$ is chosen such that no interference between the first and the second conductive paths $10_1$, $10_2$ is possible. If the distance D is very small, it may be necessary to provide a high resistance layer 11 onto the first surface 4 of the ion conductor block 3, which lies between the first ion conductor contacting area $9_1$ and the second ion conductor contacting area $9_2$, as indicated by the dotted line in FIG. 10b. The high resistance layer 11 may also electrically connect the first ion conductor contacting area $9_1$ with the second ion conductor contacting area $9_2$.

It is possible to replace the third ion conductor contacting area $9_3$ (common contacting area) by two separate ion conductor contacting areas.

In the example shown in FIGS. 10a to 10c, the first and the second ion conductor contacting areas $9_1$, $9_2$ are parts of the top surface of the ion conductor block 3, however, the present invention is not restricted thereto. For example, the first and second ion conductor contacting areas $9_1$, $9_2$ may be replaced by alternative first and second ion conductor contacting areas $9'_1$, $9'_2$ which contact a third and a fourth surface 12, 13 (side surfaces of the ion conductor block 3), as indicated in FIG. 10b.

Figure 11A:
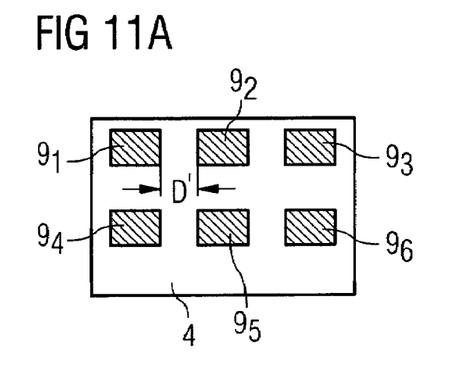
FIG. 11a shows a schematic top view of one embodiment of the CBRAM cell according to the present invention.
Figure 11B:
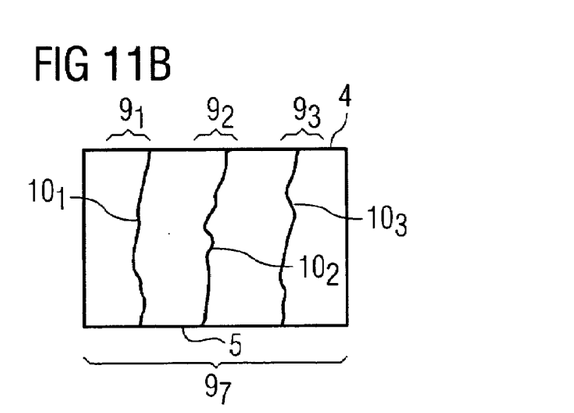
Figure 11C:
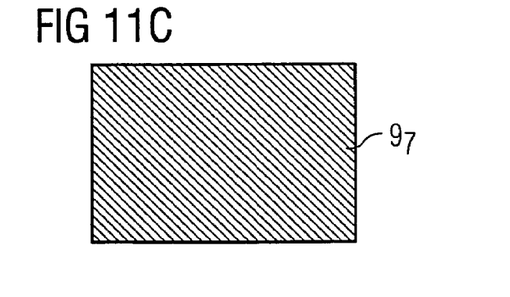
FIG. 11c shows a schematic bottom view of the embodiment shown in FIGS. 11a and 11b.

Another example is shown in FIGS. 11a to 11c. First to sixth ion conductor contacting areas $9_1$ to $9_6$ are provided on the first surface 4. In this case, it is advantageous to provide a common ion conductor contacting area $9_7$ covering the whole second surface 5 of the ion conductor block 3. According to an embodiment of the present invention, the distance D' between the first to sixth ion conductor contacting areas $9_1$ to $9_6$ is chosen such that it is ensured that the formation of one conductive path does not influence the existence or absence of another conductive path.

Figure 2:
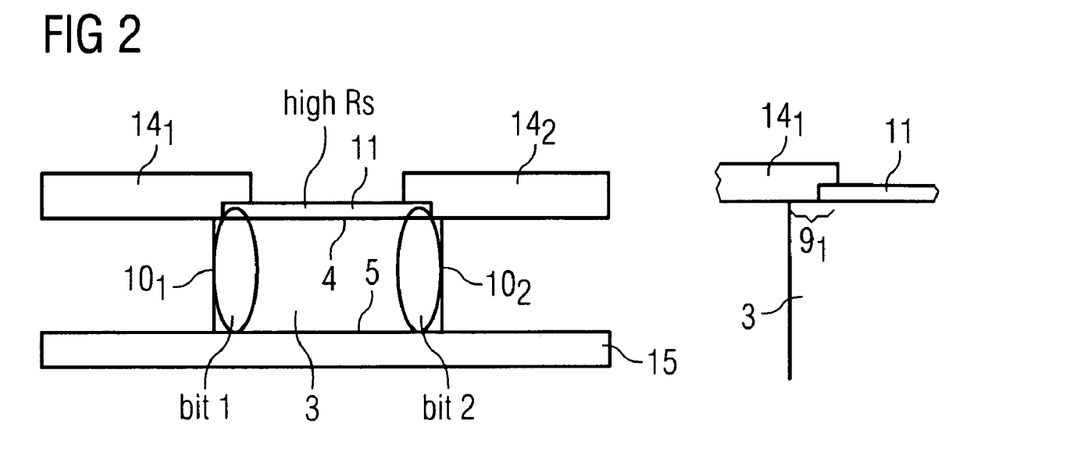
FIG. 2 shows a schematic cross-sectional view of one embodiment of the CBRAM cell according to the present invention.

FIG. 2 shows an embodiment of a CBRAM cell according to the present invention including an ion conductor block 3 having a first surface 4 (top surface) and a second surface 5 (bottom surface), the first surface 4 being covered with a high resistance layer 11 and end sections of top electrodes 14. A common bottom electrode 15 at least partially covers the second surface 5 (bottom surface) of the ion conductor block 3. A first conductive path $10_1$ is formable between the first top electrode $14_1$ and the common bottom electrode 15. A second conductive path $10_2$ is formable between a second top electrode $14_2$ and the common bottom electrode 15. The first and second conductive paths $10_1$, $10_2$ can be formed and erased independently from each other by selectively using the first top electrode $14_1$ or the second top electrode $14_2$ as voltage supplier. As shown in the right part of FIG. 2, the first ion conductor contacting area $9_1$ is both contacted by the high resistance layer 11 and the first top electrode $14_1$. Therefore, in this embodiment, the high resistance layer 11 may also include conductive material that can be driven into the ion conductor block 3 (this ensures that enough conductive material is available for the formation of the conductive metal clusters within the ion conductor block 3).

Figure 3:
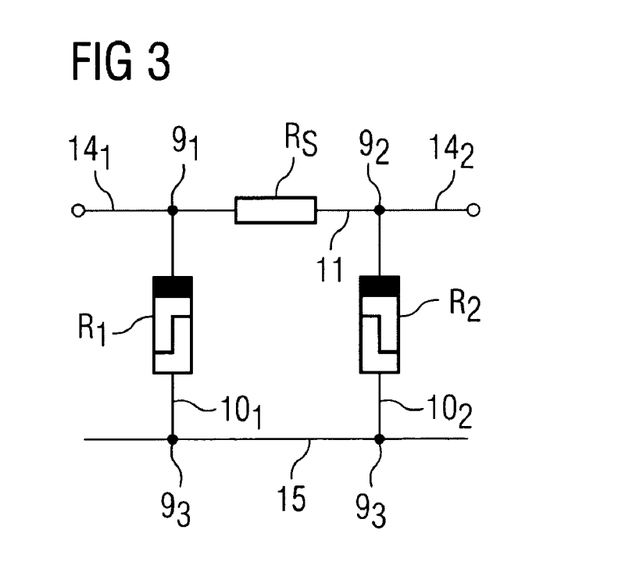
FIG. 3 shows the equivalent circuit of the embodiment shown in FIG. 2.

FIG. 3 shows an equivalent circuit of the embodiment shown in FIG. 2. As can be derived from FIG. 3, the resistance $R_S$ (the sheet resistance of the resistance layer 11) is chosen such that the formation of the first conductive path $10_1$ does not influence the existence or non-existence of the second conductive path $10_2$, and vice versa.

Figure 6:
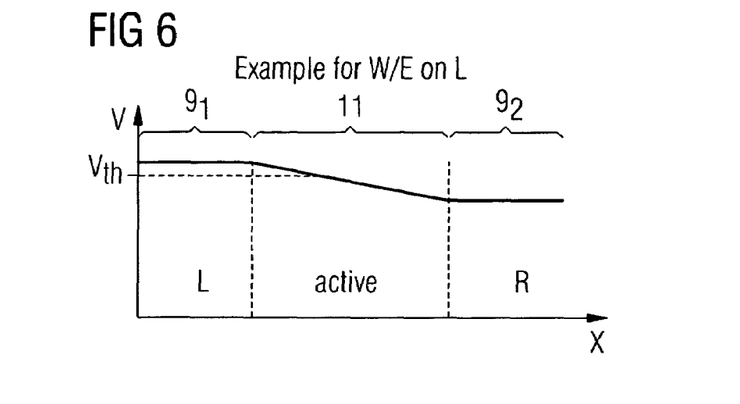
FIG. 6 shows a voltage diagram illustrating the voltage course along the top surface of the solid electrolyte shown in FIG. 2.

The voltage drop caused by the resistance $R_S$ has to be chosen such that the voltage value at the ion conductor contacting area $9_2$ is below a voltage threshold value necessary for forming the second conductive path $10_2$ if the voltage value at the first ion conductor contacting area $9_1$ is above the voltage threshold value necessary for forming the first conductive path $10_1$. The same requirement is met when erasing the first conductive path $10_1$ using the first top electrode $14_1$. This requirement is graphically visualized in FIG. 6.

Figure 7:
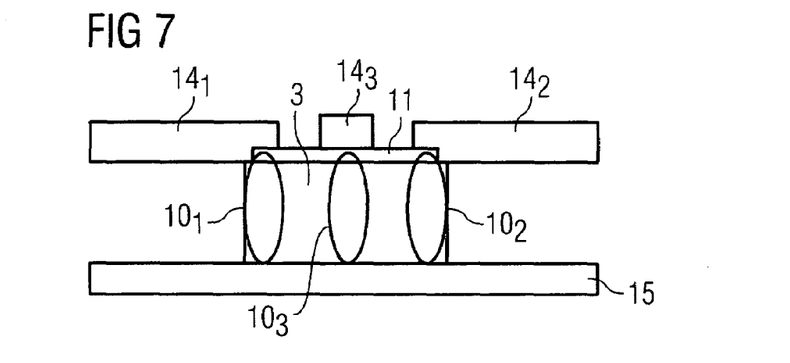
FIG. 7 shows a schematic cross-sectional view of one embodiment of the CBRAM cell according to the present invention.

FIG. 7 shows a further embodiment of a CBRAM cell according to the present invention. This embodiment is similar to the embodiment shown in FIG. 2. The embodiment shown in FIG. 7 additionally includes a third top electrode $14_3$ located in the middle between the first top electrode $14_1$ and the second top electrode $14_2$. The third top electrode $14_3$ enables the formation and erasing of a third conductive path $10_3$ within the ion conductor block 3 by applying respective voltages between the third top electrode $14_3$ and the bottom electrode 15. In the embodiment shown in FIG. 8, the third top electrode $14_3$ indirectly contacts the ion conductor block 3 via the high resistance layer 11. This is possible if the high resistance layer 11 includes a certain amount of metallic material, which forms a source of metal ions to be driven into the ion conductor block 3 in case a voltage is applied between the third top electrode $14_3$ and the bottom electrode 15. Alternatively, a contact hole may be provided within the high resistance layer 11 such that the third top electrode $14_3$ directly contacts the ion conductor block 3.

Figure 8:
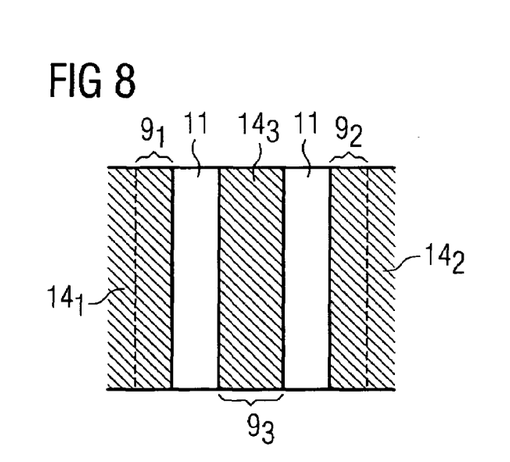
FIG. 8 shows a schematic top view of the embodiment shown in FIG. 7.

FIG. 8 shows a top view of the embodiment shown in FIG. 7.

Figure 9:
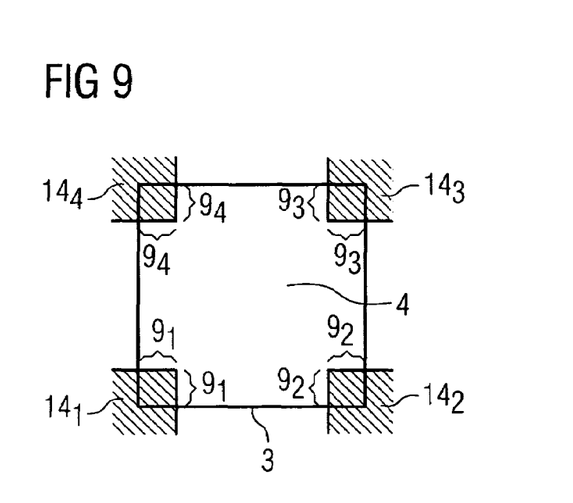
FIG. 9 shows a schematic top view of one embodiment of the CBRAM cell according to the present invention.

FIG. 9 shows a further embodiment of a CBRAM cell according to the present invention (top view). This embodiment includes first to fourth top electrodes $14_1$ to $14_4$ contacting the first surface (top surface) 4 of the ion conductor block 3 via first to fourth ion conductor contacting areas $9_1$ to $9_4$ located within the edges of the ion conductor block 3. The first to fourth ion conductor contacting areas $9_1$ to $9_4$ are located relative to one another such that the distances between those areas are as large as possible. In this embodiment, a common bottom electrode covering the whole second surface (bottom surface) of the ion conductor block 3 may be employed (not shown).

Figure 4:
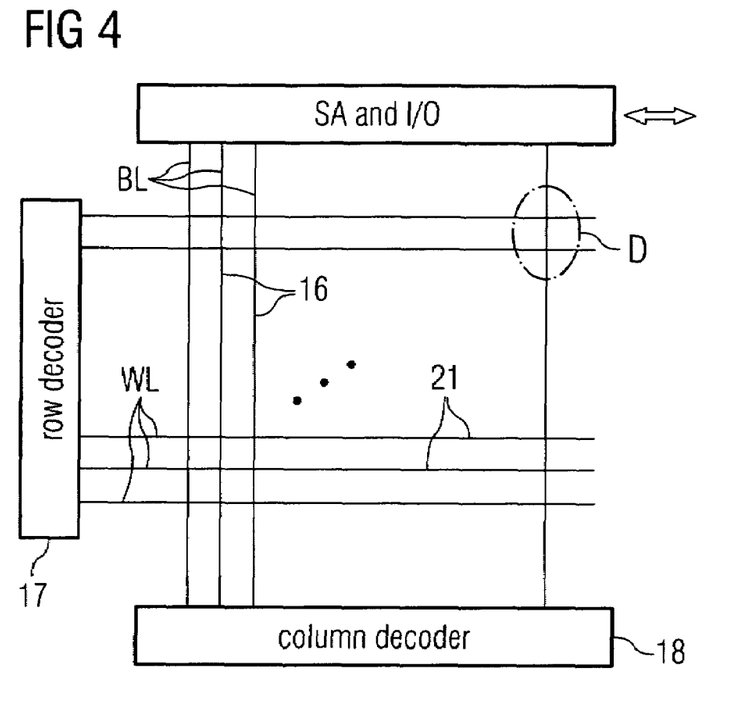
FIG. 4 shows a schematic top view of one embodiment of a CBRAM array according to the present invention.

FIG. 4 shows an embodiment of a CBRAM cell array according to the present invention. The array includes a plurality of bit lines 16 and a plurality of word lines 21, each point of intersection between a word line 21 and a bit line 16 defining a CBRAM cell area. The CBRAM cell array further includes a row decoder 17 and a column decoder 18 connected to the word lines 21 and the bit lines 16.

Figure 5:
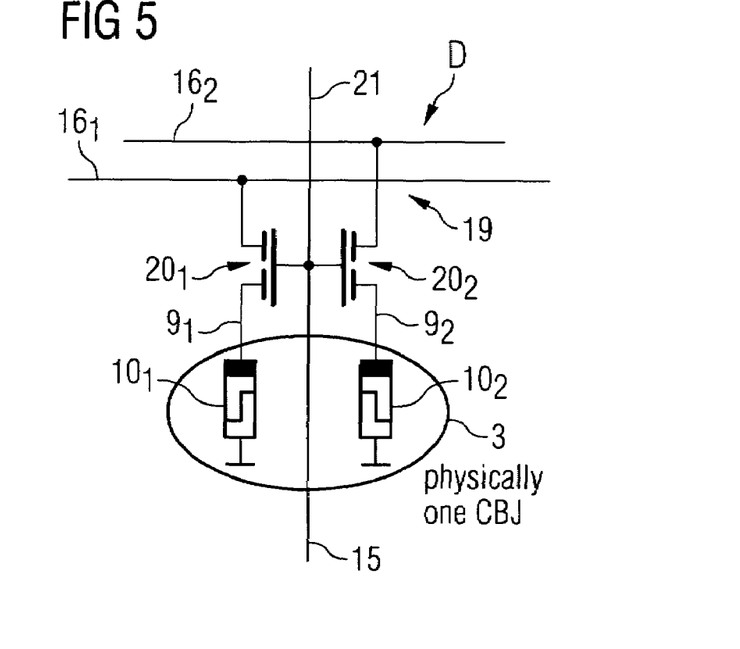
FIG. 5 shows the equivalent circuit of a detail D of the CBRAM array shown in FIG. 4.

FIG. 5 shows a possible realization of integrating the CBRAM cell according to an embodiment of the present invention into a CBRAM cell array in order to obtain an embodiment of the CBRAM cell array according to the present invention.

In this example, a CBRAM cell 19 includes an ion conductor block 3, a first and a second selecting element $20_1$, $20_2$ connecting first and second ion conductor contacting areas $9_1$, $9_2$ to a word line 21 and to first and second bit lines $16_1$, $16_2$. The word line 21 is shared by the first and the second selecting elements $20_1$, $20_2$, whereas each selecting element $20_1$, $20_2$ is connected with one of the first and second bit lines $16_1$, $16_2$. In order to form the first conductive path $10_1$ within the ion conductor block 3, the first bit line $16_1$ and the word line 21 are selected, thereby activating the first selecting element $20_1$. The first conductive path $10_1$ is then formed by applying a writing voltage via the first bit line $16_1$, the first selecting element $20_1$, and the corresponding electrode (not shown here) to the first ion conductor contacting area $9_1$. In a similar way, the second conductive path $10_2$ can be formed.

Now, with reference to FIG. 2, an example of how to program the CBRAM cell according to an embodiment of the present invention is discussed.

In this embodiment, the CBRAM cell can form two conductive paths within the ion conductor 3. As a consequence, the CBRAM cell can adopt the following logical states:

00: no conductive paths;
01: second conductive path $10_2$ existing;
10: first conductive path $10_1$ existing;
11: both first conductive path $10_1$ and second conductive path $10_2$ existing.

In order to write or erase the first conductive path $10_1$, the first top electrode $14_1$ and the common bottom electrode 15 are selected, and a writing/erasing voltage is applied between these electrodes. In order to write or erase the second conductive path $10_2$, the second top electrode $14_2$ and the common bottom electrode 15 are selected, and a writing/erasing voltage is applied between these electrodes. Due to the high resistance layer 11 interposed between the first and the second top electrodes $14_1$, $14_2$, the writing/erasing procedure concerning one conductive path does not affect a writing or erasing of the other conductive path. It is also possible to select the first and the second top electrodes $14_1$, $14_2$ and the bottom electrode 15 simultaneously, thereby being capable of simultaneously writing and/or simultaneously erasing the first and the second conductive paths $10_1$, $10_2$.

In order to determine the memory state of the CBRAM cell, two strategies may be adopted. Each strategy selects one of the first and second top electrodes $14_1$, $14_2$ and the bottom electrode 15 and routes a sensing current through the ion conductor block 3 using these electrodes. Assuming that in the "OFF" state (no conductive paths $10_1$, $10_2$ existing) $R_1$ (resistance of the first conductive path $10_1$)=$R_2$ (resistance of the second conductive path $10_2$)=infinite, and assuming that in the "ON" state (both current paths $10_1$, $10_2$ existing) $R_1$=$R_2$=$R_S$ (resistance of high resistance layer 11)=R ($R_1$, $R_2$, and $R_S$ have the same resistance value, namely R), the sensing current will experience the following resistances:

memory state 00: measured resistance=inf;
memory state 01: measured resistance=2·R;
memory state 10: measured resistance=R;
memory state 11: measured resistance=⅔·R.

In other words, the sensing current, also applied only via one of the first and second top electrodes $14_1$, $14_2$, will simultaneously detect the existence/non-existence of both current paths $10_1$, $10_2$. This memory state detection method uses a relatively sensitive sensing current processing means since four different resistance values have to be distinguished.

As an alternative strategy, if a less sensitive sensing current processing means is employed, one of the first and the second top electrode $14_1$, $14_2$ and the common bottom electrode 15 are selected. For example, if the first top electrode $14_1$ is selected, only the first current path $10_1$ will be detected. The first current path $10_1$ exists if the measured resistance is lower than 1.5·R. It does not exist if the measured resistance is higher than 1.5·R. One advantage of this measuring method is that the tolerance range of the high resistance layer 11 concerning its resistance Rs is more relaxed; the high resistance layer 11 may even be omitted. One disadvantage of this method is that two separate reading processes have to be carried out in order to determine the complete memory state of the CBRAM memory cell. On the other hand, both reading processes can be carried out simultaneously.

In the context of this description, chalcogenide material is to be understood, for example, as any compound containing sulfur, selenium, germanium and/or tellurium. In accordance with one embodiment of the invention the ion conducting material is, for example, a compound, which is made of a chalcogenide and at least one metal of the group I or group II elements of the periodic table, for example, arsene-trisulfide-silver. Alternatively, the chalcogenide material contains germanium-sulfide (GeS), germanium-selenide (GeSe), tungsten oxide ($WO_x$), copper sulfide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, copper and zinc or of a combination or an alloy of these metals.

In the following description, further aspects of the present invention will be discussed.

Memory cells comprising a solid electrolyte material are known as programmable metallization memory cells (PMC memory cells). Memory devices including such PMC memory cells are known as conductive bridging random access memory devices (CBRAM). Different memory states in a PMC memory cell are based on the development or diminishing of a conductive path in the electrolyte material between electrodes based on an applied electric field. The resistance of the virgin electrolyte material is typically high. Thus, the PMC memory cell may be set to different memory states depending on the presence of a conductive path.

Despite the potential advantages of CBRAM technology, the bit density or the cell size still is a critical parameter, compared to existing technologies like DRAM and FLASH.

According to an embodiment of the present invention, a technical solution is provided to increase the bit density for CBRAM cells. The solution according to this embodiment is compatible with other options like scalability approach or multi-level-capability.

The bit density of commercial memory products may be increased by scaling down. However, this approach has some disadvantages:

high manufacturing costs (especially costs for lithography tools);
high complexity of the process; and
relation between bit density gain and costs is bad.

The above-mentioned disadvantages may be valid especially for products that use embedded memory technology if the logic part does not require the application of most recent technology nodes.

Commercial products may use multi-level-capability (MLC). This approach increases the complexity because it is more difficult to detect and program different levels. Furthermore, there are some reliability issues in connection with MLC. The embodiments according to the present invention are compatible with MLC.

According to an embodiment of the present invention, the storage of at least two bits in one storage element for CBRAM is possible. Thus, the bit density is increased. In other words, the cell area per bit is reduced. Linked thereto are some advantages over existing solutions:

increase in bit density even for relaxed lithography conditions, avoidance of increasing manufacturing costs;

compatibility with existing solutions used in commercial products, combinations possible; and possibility for READ of two bits in one step.

According to an embodiment of the present invention, the bit density is increased by storing two bits in one CBRAM unit cell. According to an embodiment of the present invention, the developing or diminishing of two physically separated conductive paths at the edges of one storage element is achieved. These two bits or paths can be addressed individually for WRITE and ERASE as well as for READ.

The underlying effect uses a special layer on top of the active material (electrolyte layer) with a high sheet resistance $R_S$ compared to the standard top electrode layer necessary as source of conductive material. The additional voltage drop across this top layer discriminates against the location for formation and diminishing of conductive paths assumed a homogeneous distribution of threshold voltage within the active material. The top layer may consist of a material with high $R_S$ like TaN, WN, or similar. However, even the same material as the top electrode layer may be used assuming there is a significant variation of the thickness of this layer across the cell.

Read operations can be performed in three different ways. Both bits can be detected in one READ operation provided that the value for $R_S$ and Ron of the paths can be adjusted in a specific range. If the specifications for the resistance values are more relaxed (for example due to simpler process conditions) the READ operation can be performed like WRITE and ERASE operations by addressing the bits individually. These operations can be performed either simultaneously or subsequently.

As used herein the terms connected and coupled are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A solid electrolyte random access memory (CBRAM) cell, comprising:
    a solid electrolyte block comprising at least three solid electrolyte contacting areas;
    electrodes electrically connected to the solid electrolyte contacting areas; and
    conductive paths that are formable, eraseable or detectable within the solid electrolyte block based on voltages applied between the solid electrolyte contacting areas, wherein the contacting areas are spatially separated from each other such that conductive paths starting from different solid electrolyte contacting areas or ending at different solid electrolyte contacting areas do not overlap each other.

2. The CBRAM cell according to claim 1, wherein the solid electrolyte contacting areas comprise:
    a first solid electrolyte contacting area and a second solid electrolyte contacting area, the first and second solid electrolyte contacting areas being positioned over a first surface of the solid electrolyte block; and
    a common solid electrolyte contacting area being positioned over a second surface of the solid electrolyte block, wherein conductive paths starting from the first or second solid electrolyte contacting area end at the common solid electrolyte contacting area.

3. The CBRAM cell according to claim 2, wherein the first solid electrolyte contacting area is positioned at or close to a first edge region of the solid electrolyte block, and the second solid electrolyte contacting area is positioned at or close to a second edge region of the solid electrolyte block.

4. The CBRAM cell according to claim 3, wherein the first edge region faces the second edge region.

5. The CBRAM cell according to claim 3, further comprising a third solid electrolyte contacting area positioned over the first surface between the first and the second solid electrolyte contacting areas, wherein a conductive path starting from the third solid electrolyte contacting area ends at the common solid electrolyte contacting area.

6. The CBRAM cell according to claim 1, wherein the solid electrolyte contacting areas comprise:
    a first solid electrolyte contacting area, a second solid electrolyte contacting area, a third solid electrolyte contacting area and a fourth solid electrolyte contacting area, the first, second, third and fourth solid electrolyte contacting areas being positioned over a first surface of the solid electrolyte block; and
    a common solid electrolyte contacting area that is positioned over a second surface of the solid electrolyte block, wherein conductive paths starting from the first, second, third or fourth solid electrolyte contacting area end at the common solid electrolyte contacting area.

7. The CBRAM cell according to claim 6, wherein the first surface of the solid electrolyte block has a rectangular shape, each of the first to fourth solid electrolyte contacting areas being positioned at or close to a different corner of the first surface.

8. The CBRAM cell according to claim 1, further comprising a resistance layer provided on a first surface of the solid electrolyte block, wherein at least a part of the resistance layer is positioned between the solid electrolyte contacting areas positioned on the first surface, and wherein the resistance layer has a higher electrical resistance than that of the electrodes contacting the solid electrolyte contacting areas positioned on the first surface.

9. The CBRAM cell according to claim 1, wherein the solid electrolyte contacting areas are surface areas of the solid electrolyte block that are directly contacted by the electrodes.

10. The CBRAM cell according to claim 8, wherein at least one solid electrolyte contacting area is at least partly covered by the resistance layer.

11. The CBRAM cell according to claim 10, wherein at least the parts of the resistance layer that cover the at least one solid electrolyte contacting area comprise ions for forming the conductive paths.

12. The CBRAM cell according to claim 8, wherein a material of the resistance layer is the same as that of the first electrodes, and the thickness of the resistance layer is smaller than the thicknesses of the first electrodes.

13. The CBRAM cell according to claim 8, wherein the resistance layer comprises metal nitride.

14. The CBRAM cell according to claim 13, wherein the resistance layer is selected from the group of materials consisting of tantalum nitride (TaN), tungsten nitride (WN), doped silicon (Si), and combinations thereof.

15. The CBRAM cell according to claim 2, wherein the first surface of the solid electrolyte block faces the second surface of the solid electrolyte block.

16. The CBRAM cell according to claim 2, wherein the first surface is a top surface of the solid electrolyte block, and the second surface is a bottom surface of the solid electrolyte block.

17. A CBRAM cell array including a plurality of CBRAM cells, each CBRAM cell comprising:
- a solid electrolyte block comprising at least three solid electrolyte contacting areas;
- electrodes electrically connected to the solid electrolyte contacting areas; and
- conductive paths that are formable, eraseable or detectable within the solid electrolyte block based on voltages applied between the solid electrolyte contacting areas, wherein the contacting areas are spatially separated from each other such that conductive paths starting from different solid electrolyte contacting areas or ending at different solid electrolyte contacting areas do not overlap each other.

18. The CBRAM cell array according to claim 17, wherein the solid electrolyte contacting areas comprise:
- a first solid electrolyte contacting area and a second solid electrolyte contacting area, the first and second solid electrolyte contacting areas being positioned over a first surface of the solid electrolyte block; and
- a common solid electrolyte contacting area that is positioned over a second surface of the solid electrolyte block, wherein conductive paths starting from the first or second solid electrolyte contacting area end at the common solid electrolyte contacting area.

19. The CBRAM cell array according to claim 18, wherein the first solid electrolyte contacting area is positioned at or close to a first edge region of the solid electrolyte block, and the second solid electrolyte contacting area being positioned at or close to a second edge region of the solid electrolyte block.

20. The CBRAM cell array according to claim 19, wherein the first edge region faces the second edge region.

21. The CBRAM cell array according to claim 19, further comprising a third solid electrolyte contacting area positioned over the first surface between the first and the second solid electrolyte contacting areas, wherein a conductive path starting from the third solid electrolyte contacting area ends at the common solid electrolyte contacting area.

22. The CBRAM cell array according to claim 18, wherein the solid electrolyte contacting areas comprise:
- a first solid electrolyte contacting area, a second solid electrolyte contacting area, a third solid electrolyte contacting area and a fourth solid electrolyte contacting area, the first, second, third and fourth solid electrolyte contacting areas being positioned over a first surface of the solid electrolyte block; and
- a common solid electrolyte contacting area that is positioned over a second surface of the solid electrolyte block, wherein conductive paths starting from the first, second, third or fourth solid electrolyte contacting area end at the common solid electrolyte contacting area.

23. The CBRAM cell array according to claim 22, wherein the first surface of the solid electrolyte block has a rectangular shape, each of the first to fourth solid electrolyte contacting areas being positioned at or close to a different corner of the first surface.

24. The CBRAM cell array according to claim 22, wherein the electrodes connected to the first, second, third and fourth solid electrolyte contacting areas are electrically connected to bit lines of the CBRAM cell array, and wherein the electrode connected to the common solid electrolyte contacting area is electrically connected to a word line of the CBRAM cell array.

* * * * *